(12) United States Patent
Liu

(10) Patent No.: US 6,979,521 B1
(45) Date of Patent: Dec. 27, 2005

(54) METHOD OF MAKING GRAYSCALE MASK FOR GRAYSCALE DOE PRODUCTION BY USING AN ABSORBER LAYER

(75) Inventor: Xinbing Liu, Acton, MA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/880,047

(22) Filed: Jun. 29, 2004

(51) Int. Cl.[7] .............................. G03F 1/00; G03C 5/00
(52) U.S. Cl. ........................... 430/5; 430/321; 430/322
(58) Field of Search .............................. 430/5, 321, 322

(56) References Cited

U.S. PATENT DOCUMENTS

| | | | |
|---|---|---|---|
| 5,078,771 A | 1/1992 | Wu | |
| 5,310,623 A | 5/1994 | Gal | |
| 6,071,652 A | 6/2000 | Feldman et al. | |
| 6,420,073 B1 | 7/2002 | Suleski et al. | |
| 6,562,523 B1 | 5/2003 | Wu et al. | |
| 6,613,498 B1 | 9/2003 | Brown et al. | |
| 6,638,667 B2 | 10/2003 | Suleski et al. | |
| 2004/0009413 A1 * | 1/2004 | Lizotte | 430/5 |

* cited by examiner

*Primary Examiner*—Geraldine Letscher
(74) *Attorney, Agent, or Firm*—Harness, Dickey & Pierce, PLC

(57) ABSTRACT

The present invention relates to manufacturing grayscale masks that are used for mass-producing grayscale DOEs. More specifically, the present invention provides a method whereby a grayscale mask is fabricated by using an absorber layer and a photoresist with a laser writer. The method of the present invention includes the steps of providing a substrate with a known layer of absorber and a layer of photoresist, exposing the photoresist to a grayscale pattern from a laser writer, developing the photoresist into variable thickness, and transferring the surface relief pattern from the photoresist layer onto the absorber layer by etching.

25 Claims, 3 Drawing Sheets

METHOD OF MAKING GRAYSCALE MASK FOR GRAYSCALE DOE PRODUCTION BY USING AN ABSORBER LAYER

FIELD OF THE INVENTION

The present invention relates to manufacturing grayscale masks that are used for mass-producing grayscale diffractive optical lenses (DOEs). More specifically, the present invention provides a method whereby a grayscale mask is fabricated by exposing photoresist to a laser writer.

BACKGROUND OF THE INVENTION

There is an ever-increasing demand for more sophisticated, smaller, and less expensive consumer electronic devices in today's high-tech marketplace. Consumer products, such as the optical disc reader and writer (e.g., compact disc (CD), digital versatile disc (DVD), and blu-ray disc (BD) players and writers), are selling in record numbers. As a result, new and innovative technologies for these optical disc readers and writers keep emerging from developers. One area of design in the optical disc readers and writers is the optical disc pick up.

The optical pickup uses DOEs and lasers to optically read or write to an optical disc (e.g., CD, DVD, or BD). Unlike conventional optical components that utilize refraction and/or reflection, the DOE enables parallel processing by optically diffracting and directly controlling the optical phases. Therefore, a wide range of applications, including, for example, multi-spot beam splitters or shapers, can be expected as a result of this preferred benefit. Conventionally, the DOEs in optical pickups are manufactured to be binary, i.e., the DOEs only have two phase levels. Binary DOEs are easier to manufacture because they are compatible with the standard semiconductor fabrication processes, which are well developed. However, binary DOEs generally suffer lower diffraction efficiencies. Additionally, binary DOEs produces symmetric diffraction orders (e.g., a −1 order has the same intensity as a +1 order), whereas for many DOE applications—optical pickups included—asymmetric diffraction orders are desired. These drawbacks result in an inefficient optical pickup. Therefore, there exists a need to provide a more efficient DOE which does not employ binary beam splitting for optical pickups.

The grayscale DOE, a DOE that has more that two phase levels, is a type of DOE that can be more efficient and produce asymmetric diffraction orders. However, grayscale DOEs have been difficult and expensive to fabricate and, therefore, inhibit manufacturers from using them in optical pickups. Therefore, there exists a need to provide a means of inexpensively manufacturing grayscale DOEs.

Currently, there are three major methods of manufacturing grayscale masks which are used to fabricate grayscale DOEs.

First, a method of creating grayscale masks for grayscale DOE fabrication is described in U.S. Pat. No. 5,310,623, entitled, "Method for fabricating microlenses." The '623 patent details a half-tone method of manufacturing grayscale masks. However, half-tone manufacturing techniques employ a series of binary pixels, which collectively vary the transmission of light approximating a grayscale mask which may be used to create grayscale DOEs. Because this is another binary approach, the resolution is limited. Therefore, there exists a need to provide a means of fabricating grayscale masks with greater resolution than that of half-tone grayscale masks.

Second, a method of creating grayscale masks for grayscale DOE fabrication is described in U.S. Pat. No. 5,078,771, entitled, "Method of making high energy beam sensitive glasses." The '771 patent details a method whereby a high-energy beam sensitive-glass (HEBS-glass) illuminates the mask with varying intensities, and thereby creates a grayscale mask. However, the HEBS-glass transmission often changes during the exposure times, which results in non-identical grayscale masks. Therefore, there exists a need to provide a means of identically manufacturing a number of grayscale masks.

Third, a method of making a grayscale mask for manufacturing grayscale DOEs is described in U.S. Pat. No. 6,638,667, entitled, "Fabricating optical elements using a photoresist formed using of a gray level mask." The '667 patent details a method whereby grayscale patterns are created by varying the thickness of a light absorber layer. The varying thickness in the absorber layer is created by using a series of binary masks. However, employing a series of binary masks is a cumbersome and costly means of manufacturing a grayscale mask. Also, a series of binary masks create only an approximation of a true grayscale mask. Therefore, there exists a need to provide a means of creating true grayscale masks in an efficient manner without employing binary masks.

The '667 patent further discloses use of a nickel alloy called "inconel" as the absorber layer. However, because metals have very high light attenuation, the metal layer must be very thin (~0.1 $\mu$m or less) to allow adequate light to transmit through the layer. In practice it is difficult to control the thickness of such layers due to the small overall thickness required—any small variation in thickness can have a large variation in transmitted light. In U.S. Pat. No. 6,613,498, assigned to Mems Optical, the use of SiO for the absorber layer is described. However, an absorber material, such as SiO, has fixed absorption coefficient at a given wavelength. It is difficult to obtain desired total absorption and the desired thickness since the absorption coefficient is fixed—to obtain a desired maximum absorption one must use a fixed thickness. Therefore, there exists a need to provide a means of absorber layer with adjustable levels of absorption. Also, applying the metal layer or SiO absorber by evaporation can be a difficult process. Therefore, there exists a need to provide a means of applying the absorber layer in an easy and convenient way.

It is therefore an object of the invention to provide a means of creating a more efficient DOE for optical pickups which do not employ binary beam splitting.

It is another object of the invention to provide a means of inexpensively manufacturing grayscale DOEs.

It is yet another object of the invention to provide a means of creating true grayscale masks in an efficient manner without employing binary masks.

It is yet another object of the invention to provide a means of fabricating grayscale masks with greater resolution than that of half-tone grayscale masks.

It is yet another object of the invention to provide a means of identically manufacturing a number of grayscale masks.

It is yet another object of the invention to provide a means of easily creating a light-absorbing layer for making a grayscale mask whose absorption and thickness are adjustable to satisfy a broad range of specifications.

SUMMARY OF THE INVENTION

The present invention relates to manufacturing grayscale masks that are used for mass-producing grayscale DOEs.

More specifically, the present invention provides a method whereby a grayscale mask is fabricated by using an absorber layer and a photoresist with a laser writer. The method of the present invention includes the steps of providing a substrate with a known layer of absorber and a layer of photoresist, exposing the photoresist to a grayscale pattern from a laser writer, developing the photoresist into variable thickness, and transferring the surface relief pattern from the photoresist layer onto the absorber layer by etching.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

The present invention relates to manufacturing grayscale masks used for mass-producing grayscale diffractive optical lenses (DOEs). More specifically, the present invention provides a method whereby a grayscale mask is fabricated by exposing photoresist with a laser writer. The present invention also provides a means of creating a light-absorbing layer for making a grayscale mask whose absorption and thickness are adjustable.

Figure 1A:
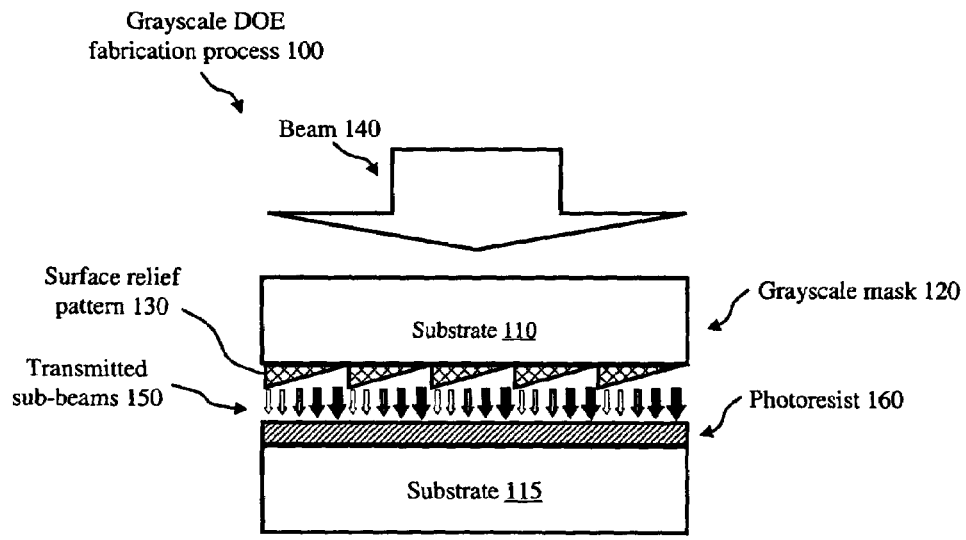
FIG. 1A illustrates a grayscale DOE fabrication process using contact imaging, including a grayscale mask consisting of a substrate and a surface relief pattern that has variable light transmission, an incident beam, a plurality of transmitted sub-beams, photoresist, and another substrate, in a grayscale DOE fabrication process.
Figure 1B:
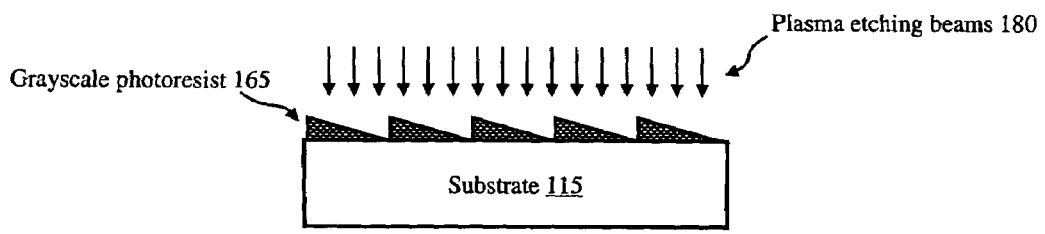
FIG. 1B illustrates grayscale photoresist after light exposure and chemical development, plasma etching beams, and substrate, in a grayscale DOE fabrication process.
Figure 1C:
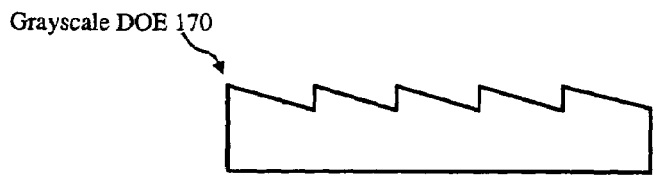
FIG. 1C illustrates a grayscale DOE created by grayscale DOE fabrication process in a grayscale DOE fabrication process.

FIGS. 1A, 1B, and 1C illustrate an example grayscale DOE fabrication process 100 where a grayscale mask 120 is employed.

FIG. 1A illustrates a grayscale DOE fabrication process 100 using contact imaging, including a grayscale mask 120 including of a substrate 110 and a surface relief pattern 130 that has variable light transmission, an incident beam 140, a plurality of transmitted sub-beams 150, photoresist 160, substrate 115 in grayscale DOE fabrication process 100.

FIG. 1B illustrates grayscale photoresist after light exposure and chemical development, plasma etching beams 180, and substrate 115, in grayscale DOE fabrication process 100.

FIG. 1C illustrates a grayscale DOE 170 created by grayscale DOE fabrication process 100 in grayscale DOE fabrication process 100.

In operation, grayscale mask 120 is used with beam 140 to pattern photoresist 160. Since grayscale mask 120 has variable transmission from point to point depending on the thickness of surface relief pattern 130 the patterned photoresist 160 after light exposure and chemical development (not shown) becomes grayscale photoresist 165. Plasma etching beam 180 is conducted on grayscale photoresist 165 transferring the grayscale photoresist 165 into substrate 115 creating grayscale DOE 170.

Figure 2A:
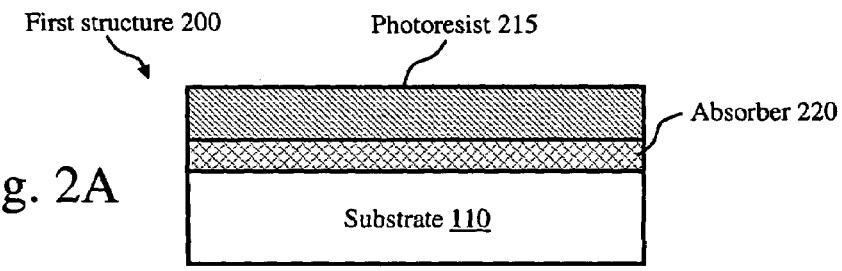
FIG. 2A illustrates a first structure, including a substrate, a photoresist, and an absorber.

FIG. 2A illustrates first structure 200, including a substrate 110, a photoresist 215 and an absorber 220.

Figure 2B:
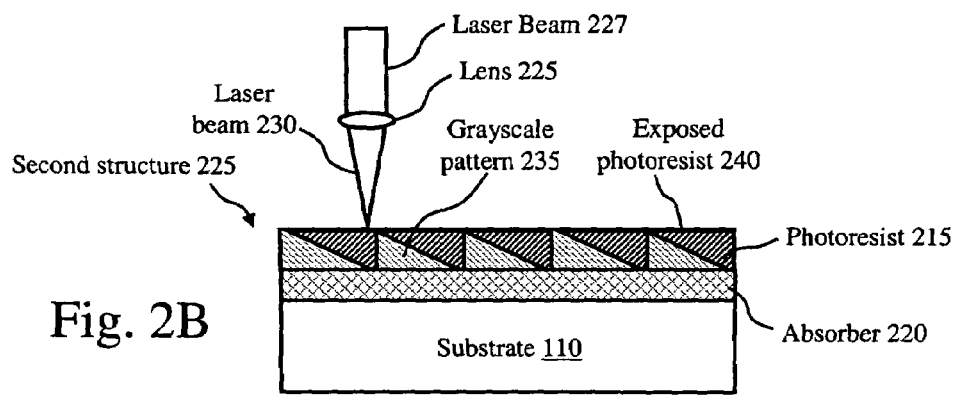
FIG. 2B illustrates a second structure, including a substrate, a photoresist, an absorber, a laser beam, a grayscale pattern, and an exposed photoresist.

FIG. 2B illustrates second structure 225, including substrate 110, photoresist 215, absorber 220, a focusing lens 225, a laser beam 227, a focused laser beam 230, a grayscale pattern 235 and an exposed photoresist 240.

Figure 2C:
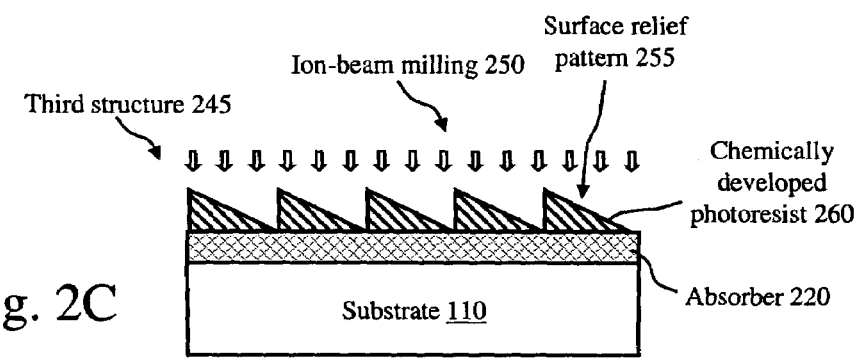
FIG. 2C illustrates a third structure, including a substrate, an absorber, an ion-beam milling, surface relief pattern, and an ion-beam-milled photoresist.

FIG. 2C illustrates third structure 245, including substrate 110, absorber 220, ion-beam milling 250, surface relief pattern 255 and chemically developed photoresist 260.

Figure 2D:
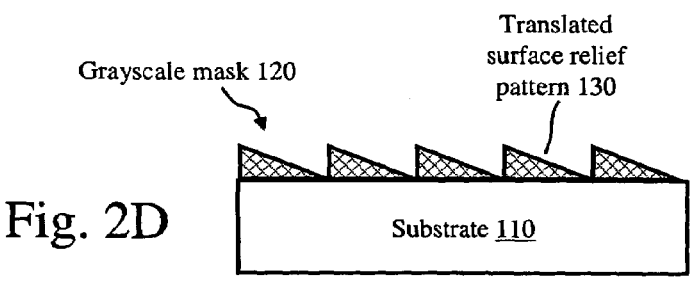
FIG. 2D illustrates a grayscale mask, including a substrate and a translated surface relief pattern.

FIG. 2D illustrates grayscale mask 120, including substrate 110 and translated surface relief pattern 130.

FIGS. 2A, 2B, 2C, and 2D are described in more detail in reference to Method 300.

Figure 3:
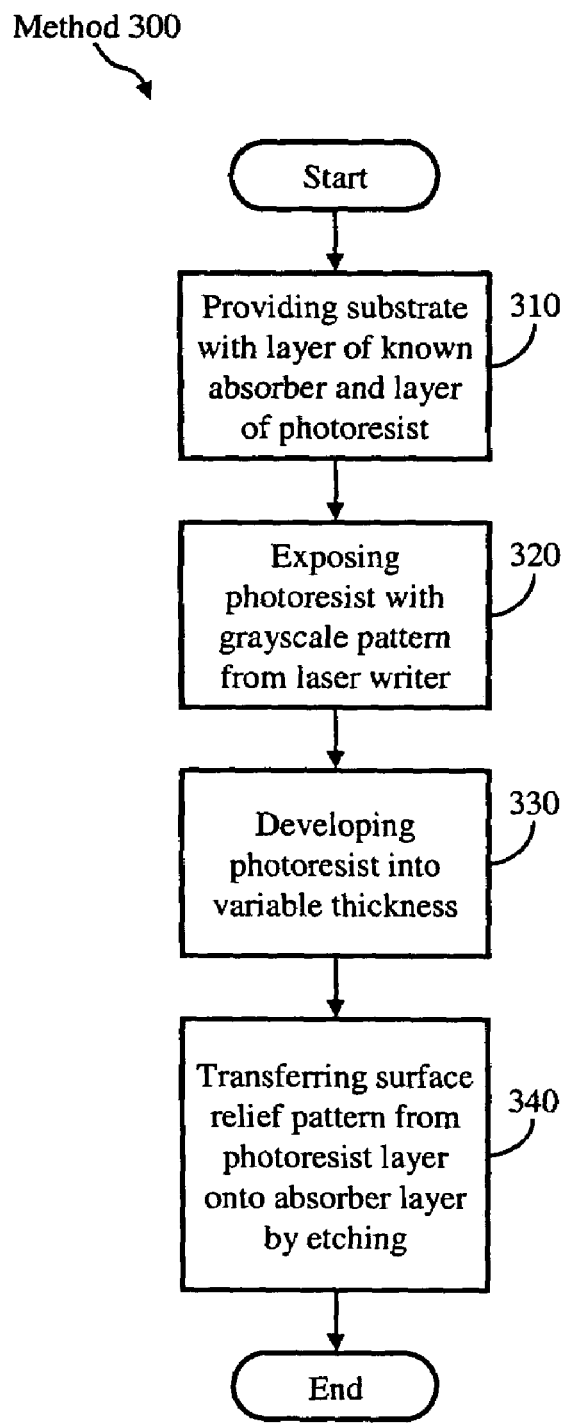
FIG. 3 illustrates a flow chart method of fabricating a grayscale mask.

FIG. 3 illustrates a flow chart method 300 of fabricating grayscale mask 120.

Step 310: Providing substrate with layer of known absorber and layer of photoresist In this step, substrate 110 for grayscale mask 120 is provided with a layer of absorber 220 atop which photoresist 215 is overlaid to form first structure 200, as illustrated in FIG. 2A. In one example, substrate 110 may be a fused silica ($SiO_2$), which is a polished and transparent glass substrate manufactured by Corning Inc. Example absorber layers may be semiconductor materials such as silicon, glass imbedded with absorbing quantum dots, or a carrier material imbedded with a light absorbing material, such as dyes, pigments, or nanocrystals (quantum dots). The absorber layer may be thin, e.g., 0.1–3.0 micrometers ($\mu$m), such that light may transmit variably through the mask, depending on its thickness, due to the exponential attenuation of light with thickness in an absorbing material. It is envisioned, however, that thicker absorber layers may be used for applications requiring less resolution and/or larger features. Any photoresist which is compatible with ion-beam milling 150 or reactive ion etch (RIE) may be used. Method 300 proceeds to step 320.

The use of absorber 220 embedded within carrier materials is particularly advantageous; examples of absorber include dyes, pigments, and/or nanocrystals. By changing the concentration of the absorbing material in the carrier material, the maximum absorption of absorber 220 is changed. In one example, the carrier material is a polymer material in a solvent, thus in a liquid form initially. The carrier itself may or may not be light-absorbing. One example of a carrier is the photoresist itself. Examples of absorbing materials include dyes, such as UV388 made by ColorChem International Corp; pigments, such as Neolor made by ColorChem; and nanocrystals, such as CdSe or CdTe nanocrystals (quantum dots), particularly EviDots manufactured by Evident Technologies. Nanocrystals are engineered to different sizes that exhibit different light absorption and fluorescence properties. In one example these absorbing materials are embedded in the carrier material with various concentrations, thus varying the amount of light it absorbs. In one example, the carrier embedded with absorber is then spin-coated to the desired thickness on substrate 110.

A sub-method within the step of providing the substrate having the layer of absorber is a sub-method of producing the layer of absorber. The sub-method includes determining a target absorption of the layer of absorber based on a target optical density and a thickness of the layer of absorber. The target optical density is determined based on a dynamic range (i.e., number of steps) of grayscale levels of the grayscale pattern. The thickness of the layer of absorber is determined based on a feature size of a product to be manufactured by use of the mask, and based on a depth of focus of an imaging system capable of using the mask to manufacture the product. Maximum and minimum thicknesses may be determined to define a thickness range. Then a target thickness may be selected within the range for one or more imaging systems that can use the mask to manufacture the product. It is envisioned that any imaging system that can be designed or adapted to use the mask is capable of using the mask to manufacture the product. Once the target absorption of the absorber layer is determined, absorber material is dispersed in the carrier material to achieve the target absorption by attaining an absorption material concentration as a function of the thickness of the layer of absorber and absorption characteristics of the absorber material.

Step 320: Exposing Photoresist with Grayscale Pattern from Laser Writer

In this step, photoresist 215 is exposed to focused laser beam 230 from a laser writer (not shown) in a grayscale manner which, by varying light intensity, creates exposed photoresist 240 and grayscale pattern 235 to form second structure 225 as illustrated in FIG. 2B. In one example, the laser writer may be LW2003 from Microtech. LW2003 uses a helium-cadmium (HeCD) laser with a wavelength ($\lambda$) equal to 442 nm. The photoresist 240 may be either a positive or negative photoresist.

In an alternate embodiment, an electron-beam (e-beam) writer may be substituted for the laser writer, in this case the photoresist 215 is replaced with a suitable e-beam resist. An example e-beam writer is a Leica SB350 DW. Method 300 proceeds to step 330.

Step 330: Developing Photoresist into Variable Thickness

In this step, the exposed photoresist 240 is developed into a surface relief pattern with varying thickness, depending on the exposure. During the developing step, the exposed photoresist 240 exfoliates, which produces surface relief pattern 255, as illustrated in FIG. 2C. If a positive photoresist is used, the surface relief pattern 255 becomes thinner with more light exposure. Conversely, if a negative photoresist is used it becomes thicker with more light. Method 300 proceeds to step 340.

Step 340: Transferring Translated Surface Relief Pattern from Photoresist Layer onto Absorber Layer by Etching In this step, the surface relief pattern 255 is translated onto absorber 220 by an etching process such as ion-beam milling 250, which forms translated surface relief pattern 130, as illustrated in FIGS. 2C and 2D. Ion-beam milling 250 is done uniformly over the photoresist 215, such that chemically developed photoresist 260 and, subsequently, absorber 220 uniformly mills. The resultant grayscale mask 120 with translated surface relief pattern 130 in the absorber layer emerges. Note: the dynamic range of grayscale mask 120 is dependent on the maximum thickness difference in translated surface relief pattern 130 in the absorber layer.

In an alternate embodiment, RIE may be substituted for ion-beam milling 250. Method 300 ends.

Thus, a means of manufacturing a more efficient DOE for optical pickups which do not employ binary beam splitting is provided. Second, a means of inexpensively manufacturing grayscale DOEs is provided. Third, a means of creating true grayscale masks in an efficient manner without employing binary masks is provided. Fourth, a means of fabricating grayscale masks with greater resolution than that of halftone grayscale masks is provided. Finally, a means of identically manufacturing a number grayscale masks is provided.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of manufacturing a grayscale mask, comprising:
   providing a substrate having a layer of absorber that includes a carrier material embedded with a light absorbing material and having a layer of photoresist;
   exposing the layer of photoresist to a grayscale pattern from a laser writer;
   developing the photoresist layer into a surface relief pattern of variable thickness;
   transferring the surface relief pattern from the photoresist layer onto the absorber layer by etching; and
   adjusting a concentration of the light absorbing material embedded in the carrier material in order to vary a maximum absorption of the absorber layer.

2. The method of claim 1, wherein providing the substrate includes providing a layer of absorber atop which the layer of photoresist is overlaid.

3. The method of claim 1, wherein providing the substrate includes providing a fused silica ($SiO_2$), which is a polished and transparent glass substrate.

4. The method of claim 1, wherein providing the substrate includes providing a substrate having a layer of absorber including semiconductor material.

5. The method of claim 1, wherein providing the substrate includes providing a substrate having a layer of absorber including silicon.

6. The method of claim 1, wherein providing the substrate includes providing a substrate having a layer of absorber including glass embedded with absorbing quantum dots.

7. The method of claim 1, wherein providing the substrate includes providing a carrier material embedded with a light absorbing material that is a dye.

8. The method of claim 1, wherein providing the substrate includes providing a carrier material embedded with a light absorbing material that is a pigment.

9. The method of claim 1, wherein providing the substrate includes providing a carrier material embedded with a light absorbing material that is nanocrystals (quantum dots).

10. The method of claim 1, wherein providing the substrate includes providing a carrier material that is a polymer material in a solvent.

11. The method of claim 1, wherein providing the substrate includes providing a carrier material that is the photoresist layer.

12. The method of claim 1, wherein providing the substrate includes providing a carrier material in which absorbing materials are embedded with various concentrations, thus varying the amount of light absorbed.

13. The method of claim 1, wherein providing the substrate includes providing a substrate having absorber spin-coated to a desired thickness on the substrate.

14. The method of claim 1, wherein providing the substrate includes determining a target absorption based on a target optical density and a thickness of the layer of absorber.

15. The method of claim 14, wherein determining the target absorption includes determining the target optical density based on a dynamic range of grayscale levels of the grayscale pattern.

16. The method of claim 14, wherein determining the target absorption includes determining the thickness of the layer of absorber based on a feature size of a product to be manufactured by use of the mask, and based on a depth of focus of an imaging system capable of using the mask to manufacture the product.

17. The method of claim 14, further comprising dispersing the absorber material in the carrier material to achieve the target absorption by attaining an absorption material concentration as a function of the thickness of the layer of absorber and absorption characteristics of the absorber material.

18. The method of claim 1, wherein providing the substrate includes providing a substrate having the layer of absorber, wherein the layer of absorber has a thickness in a range of 0.1–3.0 micrometers ($\mu$m), such that light may transmit variably through the mask, depending on its thickness, due to exponential attenuation of light with thickness in an absorbing material.

19. The method of claim 1, wherein exposing the layer of photoresist to the grayscale pattern from the laser writer includes exposing the layer of photoresist to a focused laser beam from a laser writer in a grayscale manner which, by varying light intensity, creates an exposed photoresist and grayscale pattern.

20. The method of claim 1, wherein exposing the layer of photoresist to the grayscale pattern from the laser writer includes exposing a layer of positive photoresist to the greyscale pattern from the laser writer.

21. The method of claim 1, wherein exposing the layer of photoresist to the grayscale pattern from the laser writer includes exposing a layer of negative photoresist to the greyscale pattern from the laser writer.

22. The method of claim 1, wherein exposing the layer of photoresist to the grayscale pattern from the laser writer includes exposing the layer of photoresist to the grayscale pattern from an electron-beam (e-beam) writer, wherein the layer of photoresist is an e-beam resist.

23. The method of claim 1, wherein developing the photoresist layer into a surface relief pattern of variable thickness includes causing exposed photoresist to exfoliate, thereby producing the surface relief pattern.

24. The method of claim 1, wherein transferring the surface relief pattern from the photoresist layer onto the absorber layer by etching includes using an ion-beam milling process, wherein ion-beam milling is performed uniformly over the photoresist layer, such that chemically developed photoresist and, subsequently, absorber layer uniformly mills.

25. The method of claim 1, wherein transferring the surface relief pattern from the photoresist layer onto the absorber layer by etching includes using a reactive ion etching (RIE) process.

* * * * *